(12) United States Patent  
Song et al.

(10) Patent No.: US 8,952,236 B2  
(45) Date of Patent: Feb. 10, 2015

(54) HYBRID TYPE ROOF PANEL HAVING SOLAR CELL

(71) Applicant: Hyundai Motor Company, Seoul (KR)

(72) Inventors: Mi Yeon Song, Seoul (KR); Hae Yoon Jung, Seoul (KR); Eun Young Lee, Seoul (KR); Sang Hak Kim, Gyeonggi-do (KR); Won Jung Kim, Gyeonggi-do (KR); Sung Geun Park, Gangwon-do (KR); Ji Yong Lee, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 13/963,301

(22) Filed: Aug. 9, 2013

(65) Prior Publication Data

US 2013/0319498 A1 Dec. 5, 2013

(51) Int. Cl.  
*H01L 31/042* (2014.01)  
*H01G 9/20* (2006.01)

(52) U.S. Cl.  
CPC .......... *H01L 31/0422* (2013.01); *H01L 31/042* (2013.01); *Y02E 10/542* (2013.01); *H01G 9/2068* (2013.01); *Y02T 10/7022* (2013.01)  
USPC ............................................. 136/244; 438/66

(58) Field of Classification Search  
CPC .. H01L 31/042; H01L 31/048; H01L 31/0488  
USPC ......................................... 136/244, 259, 251  
See application file for complete search history.

(56) References Cited

U.S. PATENT DOCUMENTS

2005/0046241 A1   3/2005   Sasaki et al.  
2005/0236037 A1   10/2005  Ahn et al.  
2007/0137696 A1*  6/2007   Krokoszinski et al. ....... 136/255

FOREIGN PATENT DOCUMENTS

| JP | 06-039935 A | 2/1994 |
|---|---|---|
| KR | 20-0442503 Y1 | 11/2008 |
| KR | 10-2011-0041095 A | 4/2011 |
| KR | 10-2012-0050882 | 5/2012 |
| KR | 10-2012-0059277 A | 6/2012 |

OTHER PUBLICATIONS

Machine translation of KR 10-2011-0041095.*

* cited by examiner

*Primary Examiner* — Jayne Mershon  
(74) *Attorney, Agent, or Firm* — Edwards Wildman Palmer LLP; Peter F. Corless

(57) ABSTRACT

A hybrid type roof panel of a vehicle has a solar cell mounted on the roof panel, in which two types of solar cell modules are simultaneously mounted, in order to provide a sense of openness of the roof panel and simultaneously maximize performance of the solar cell. In the roof panel covered with roof glass, two types of solar cells are disposed over an entire area of the roof glass in a hybrid manner, including: a first solar cell having transparent characteristics disposed in a center of the roof glass; and a second solar cell having better photovoltaic performance than the first solar cell disposed in an edge part of the roof glass.

12 Claims, 4 Drawing Sheets

HYBRID TYPE ROOF PANEL HAVING SOLAR CELL

CROSS-REFERENCE TO RELATED PATENT APPLICATION

This application claims the benefit of Korean Patent Application No. 10-2013-0044820, filed on Apr. 23, 2013 in the Korean Intellectual Property Office, the disclosure of which is incorporated herein in its entirety by reference.

BACKGROUND

1. Field of the Invention

The present invention relates to a roof panel of a vehicle having a solar cell module mounted thereon, and more particularly, to a hybrid type roof panel having a solar cell in which two types of solar cell modules are simultaneously mounted, in order to provide a sense of openness of the roof panel and simultaneously maximize the performance of the solar cell.

2. Description of the Related Art

Recently, the development of green cars, such as hybrid cars, electric cars, fuel cell cars, and the like, has rapidly proceeded, and various efforts have been made to apply solar cells to these cars.

In particular, when a solar cell is applied to a sunroof panel or a panorama sunroof panel of a vehicle, the sense of openness of an existing sunroof is satisfied, and simultaneously, solar energy can be utilized in various application fields. Thus, attempts to apply solar cells to the sunroof panel and the panorama sunroof panel of a vehicle have been made.

In general, the sunroof or the panorama roof of the vehicle includes tempered glass and a frame, and an outer part of the tempered glass is coated with ceramic so that the frame and a wire ring inside the vehicle cannot be seen from the outside.

In an existing roof panel having a silicon solar cell, the silicon solar cell is mounted in the center (i.e., the middle part of the tempered glass that is not coated with ceramic) of a rear side of the roof panel. Due to problems such as high cost, a lack of sense of openness, and design degradation, roof panels having silicon solar cells are not in wide use, and thus attempts to replace silicon solar cells with dye-sensitized solar cells have been made.

A dye-sensitized solar cell has several advantages, for example, its manufacturing cost is low, it can be manufactured with transparent electrodes, and a solar cell with various designs can be manufactured. Thus, many studies for applying dye-sensitized solar cells to various application fields have proceeded. In particular, there have been studies for applying the dye-sensitized solar cell to fields of electronic products, for example, a mobile phone, an MP3 player, and a game device.

Generally, in order to connect a dye-sensitized solar cell to the roof panel, a solar cell module is bonded to the existing sunroof or panorama roof.

Use of a dye-sensitized solar cell provides various advantages, such as a low cost, a sense of openness, and various color applications, in comparison with silicon solar cells. However, a dye-sensitized solar cell has poor performance as compared to that of a silicon solar cell.

SUMMARY

The present invention provides a hybrid type roof panel having a solar cell in which a first solar cell capable of providing a sense of openness is mounted in the center of the roof panel and a second solar cell having superior performance is mounted in an edge part of the roof panel so that the sense of openness of the roof panel is secured and simultaneously, the performance of the solar cell can be maximized.

According to an aspect of the present invention, there is provided a hybrid type roof panel having a solar cell in which two types of solar cells are disposed over an entire area of roof glass in a hybrid manner, including: a first solar cell having transparent characteristics disposed in a center of the roof glass; and a second solar cell having better photovoltaic performance than the first solar cell disposed in an edge part of the roof glass.

The roof glass may include a roof glass upper plate and a roof glass lower plate stacked on both top and bottom surfaces, respectively, of the first solar cell and the second solar cell.

Protection films may be interposed between the top and bottom surfaces of the first solar cell and the second solar cell such that the roof glass is attached to the first solar cell and the second solar cell.

A first protection film may be stacked on the top and bottom surfaces of the first solar cell, a second protection film may be stacked on the top and bottom surfaces of the second solar cell, and the first protection film and the second protection film may be formed with different thicknesses depending on thicknesses of the first solar cell and the second solar cell so as to offset a thickness difference between the first solar cell and the second solar cell.

An electrode of the first solar cell may be electrically connected to an electrode of the second solar cell via an inner wire, and an outer wire electrically connected to the electrode of the second solar cell may extend to an outer side of the roof glass and may be positioned at a ceramic coating part.

An outer sealing part may be formed to surround and seal the second solar cell and the roof glass upper plate and the roof glass lower plate that are laminated onto the top and bottom surfaces of the second solar cell from an outer side of the roof glass.

The first solar cell and the second solar cell may have thicknesses of less than about 4.0 mm.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
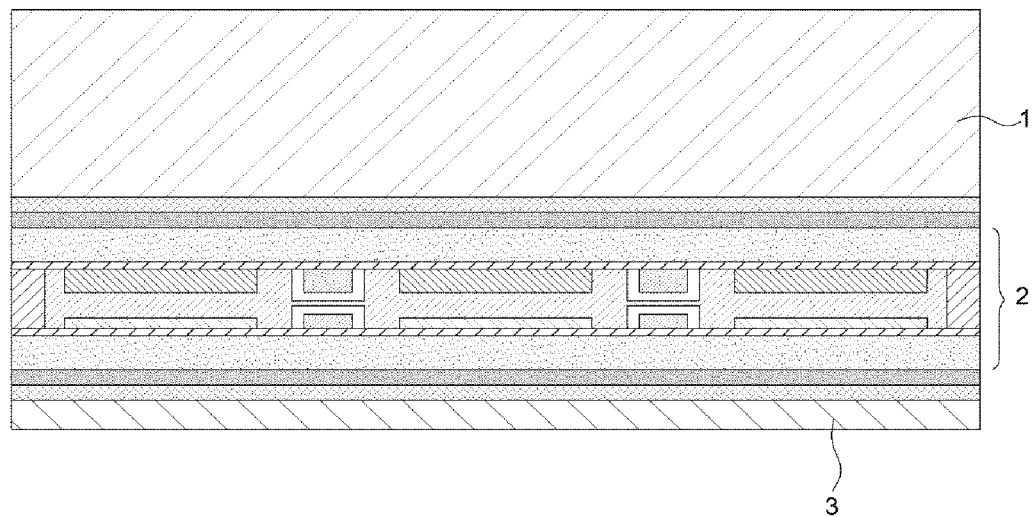
FIG. 1 (RELATED ART) is a cross-sectional view of a roof panel having a solar cell using tempered glass as roof glass.

The present invention will now be described more fully with reference to the accompanying drawings, in which exemplary embodiments of the invention are shown, so that one of ordinary skill in the art can easily embody the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

The present invention relates to a roof panel of a vehicle configured using a solar cell module, whereby two types of solar cell modules are simultaneously used, in order to provide a sense of openness of the roof panel, and simultaneously maximize the performance of the solar cell.

Thus, in the present invention, a first solar cell capable of providing the sense of openness is used in the center of the roof panel, and a second solar cell having superior performance, i.e., better performance with superior photovoltaic properties as compared to the first solar cell, is used in an edge part of the roof panel. Also, roof glass formed of laminated glass instead of roof glass formed of existing tempered glass preferably is used so that a photovoltaic area can be maximized.

In general, in laminated glass used in front glass of a vehicle, two pieces of glass are laminated, and a binding agent having excellent shock elasticity, excellent bursting strength and tensile strength in comparison with glass, such as polycarbonate (PC), polyethylene terephthalate (PET), or polyvinyl butyral (PVB), is used in a space between two pieces of glass. When a composite molecular material having excellent tensile force and elasticity as in the binding agent is laminated together with glass, the glass may not be broken even with a strong shock, but only a web-shaped fracture is generated thereon.

Thus, a hybrid type roof panel having a solar cell according to the present invention is configured to use a structure of laminated glass instead of existing tempered glass as roof glass to which the solar cell is to be attached.

When the roof panel having the solar cell is manufactured using the above laminated glass structure, a solar cell module can be attached to the entire area of roof glass, and a basic structure of a ceramic coating part for covering a frame and a wire ring, the frame, and the wire ring can be maintained substantially without change.

When the roof panel having the solar cell is manufactured using existing tempered glass as roof glass to which the solar cell is to be attached, ceramic coating is performed on an edge part of tempered glass. Thus, the roof panel having the solar cell is manufactured by attaching the solar cell module only to the center of roof glass except for the edge part of roof glass.

Figure 2:
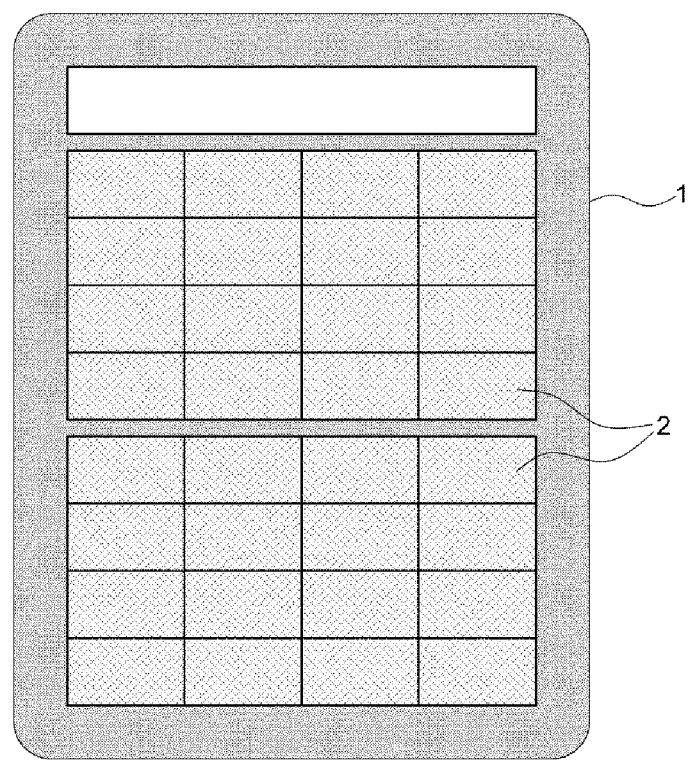
FIG. 2 (RELATED ART) is a plan view of the roof panel having the solar cell illustrated in FIG. 1.

FIG. 1 (RELATED ART) illustrates an example of a cross-sectional view of a roof panel having a solar cell using tempered glass as roof glass, and FIG. 2 (RELATED ART) illustrates a planar structure of the roof panel having the solar cell illustrated in FIG. 1.

Referring to FIG. 1, in an existing roof panel having a solar cell using tempered glass, a solar cell module 2 is attached to a bottom surface of roof glass 1 formed of tempered glass, and a back sheet 3 is attached to a lower part of the solar cell module 2.

Also, as illustrated in FIG. 2, in the existing roof panel having the solar cell using tempered glass, the solar cell module 2 is attached only to the center of the roof glass 1 except for an edge part of the roof glass 1 so that a photovoltaic area is reduced.

Figure 3:
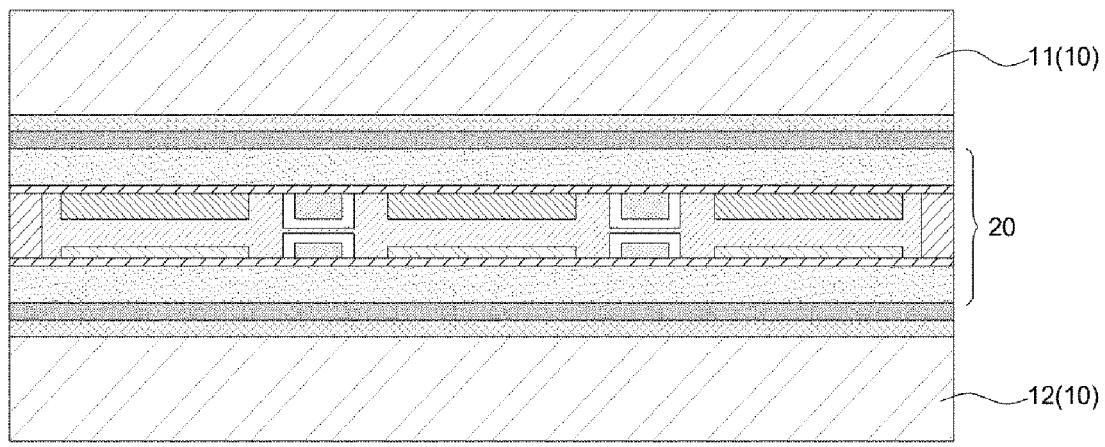
FIG. 3 is a cross-sectional view of a roof panel having a solar cell using laminated glass as roof glass.
Figure 4:
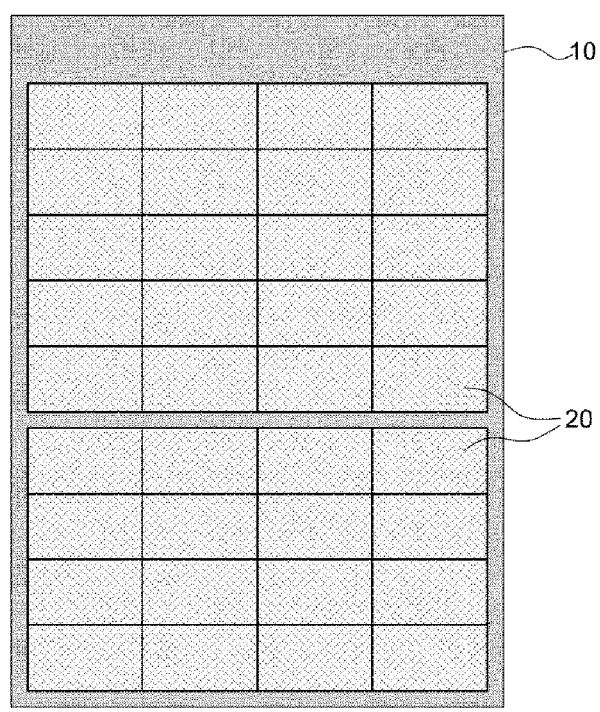
FIG. 4 is a plan view of the solar cell roof panel of FIG. 3.

FIG. 3 illustrates an example of a cross-sectional structure of a roof panel having a solar cell using laminated glass as roof glass, and FIG. 4 illustrates a planar structure of the solar cell roof panel of FIG. 3.

As illustrated in FIG. 3, when the roof panel having the solar cell is manufactured using laminated glass as the roof glass 10, a solar cell module 20 is interposed between a roof glass upper plate 11 and a roof glass lower plate 12. Thus, as illustrated in FIG. 4, the solar cell module 20 can be mounted on the entire area of the roof glass 10 regardless of ceramic coating using the edge part of the roof glass 10.

A roof panel having a solar cell according to the present invention uses laminated glass as the roof glass 10, as illustrated in FIG. 3. The roof panel having the solar cell according to the present invention has the same structure of overall weight and overall thickness as those of the existing roof panel having the solar cell illustrated in FIG. 1.

Referring to FIG. 3, in the roof panel having the solar cell according to the present invention, a glass material having high transmissivity is used in the roof glass upper plate 11, and a glass material having an edge part of a bottom surface coated with ceramic is used in the roof glass lower plate 12.

A binding agent, such as PC, PET, or PVB, is used to laminate the roof glass upper plate 11 and the roof glass lower plate 12, and the solar cell module 20 is attached to a space between the roof glass upper plate 11 and the roof glass lower plate 12. In this case, the solar cell module 20 may be a module having an overall thickness of less than about 4.0 mm using a substrate having a thickness of about 0.1 to 2.0 mm, and for example, a module having an overall thickness of about 0.2 to 4.0 mm is used as the solar cell module 20.

The edge part of the roof glass lower plate 12 is coated with ceramic. Thus, after the roof glass lower plate 12 is laminated with the roof glass upper plate 11, a frame that is generally attached to a lower part of the roof panel can be attached to a ceramic-coated portion.

In this way, if ceramic coating is performed on the edge part of the roof glass lower plate 12 attached to a lower part of the solar cell module 20, only the center of the roof panel is transparent, and the edge part of the roof panel is opaque due to the ceramic coating.

Thus, in the present invention, two types of solar cells in a hybrid manner are simultaneously used to improve the performance of the solar cell while maintaining transparent characteristics of a sunroof or a panorama roof, as described above.

Figure 5:
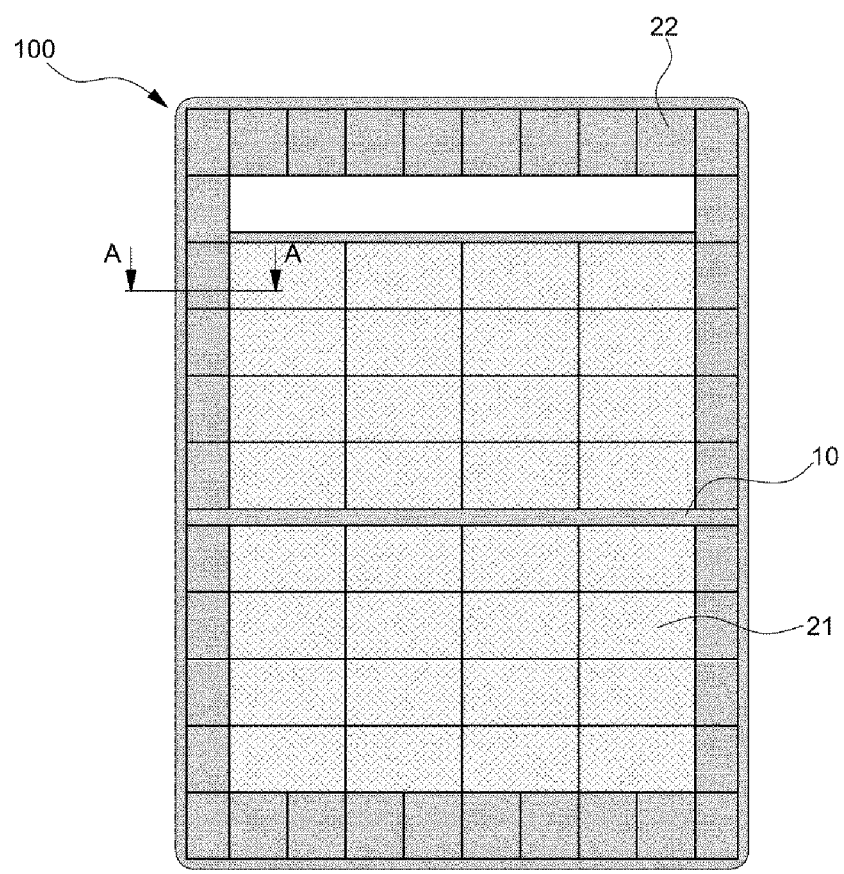
FIG. 5 is a plan view of a hybrid type roof panel having a solar cell according to an embodiment of the present invention.

FIG. 5 schematically illustrates a planar structure of a hybrid type roof panel having a solar cell according to an embodiment of the present invention. As illustrated in FIG. 5, a roof panel 100 having a solar cell according to the present invention includes a first solar cell 21 disposed in the center of roof glass 10 or a roof panel 100 and a second solar cell 22 disposed in an edge part of the roof glass 10 or the roof panel 100.

A solar cell module having transparent characteristics, for example, a dye-sensitized solar cell module, an amorphous solar cell module, or an opening type solar cell module having semi-transparent characteristics is used as the first solar cell 21. Preferably, the dye-sensitized solar cell module is used as the first solar cell 21.

The first solar cell 21 preferably is configured to provide a sense of openness of the sunroof or panorama roof of the vehicle, and is disposed only in the center of the roof panel 100.

A solar cell module having excellent photovoltaic performance, i.e., improved or better performance in comparison with the first solar cell 21, is used as the second solar cell 22, and for example, a silicon solar cell module is used as the second solar cell 22.

Since a ceramic coating part 23 is formed on a bottom surface of a roof glass lower plate 12, the edge part of the roof panel 100 in which the second solar cell 22 is disposed, is opaque. Thus, a solar cell module having excellent performance can be selected and used regardless of transparency.

In this way, the first solar cell 21 having transparent characteristics and the second solar cell 22 having excellent photovoltaic performance are used in a hybrid manner so that, when the solar cell is mounted in the roof panel of the car, existing transparent characteristics can be maintained and simultaneously, photovoltaic performance can be improved.

Figure 6:
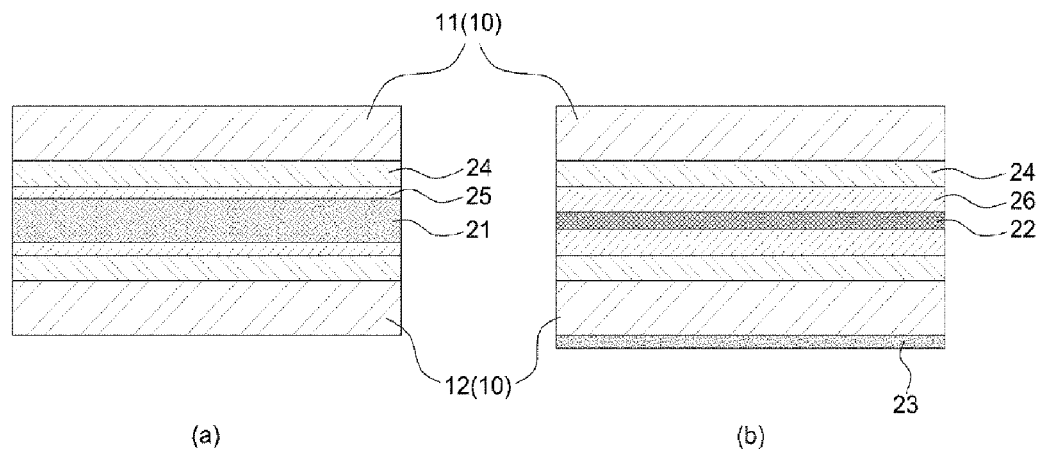
FIG. 6 is a cross-sectional view of a first solar cell and a second solar cell, which are applied to the hybrid type roof panel having the solar cell illustrated in FIG. 5.
Figure 7:
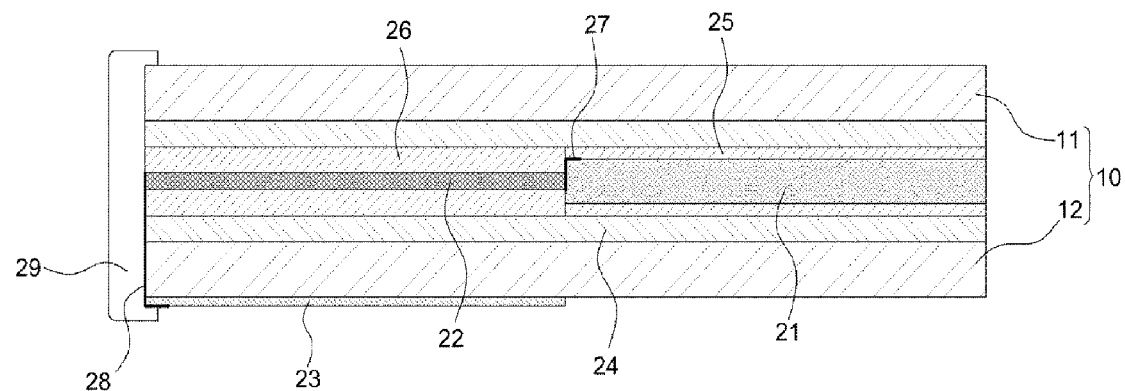
FIG. 7 is a cross-sectional view taken along a line A-A of FIG. 5, and illustrates a connection structure of the first solar cell and the second solar cell.

FIG. 6 illustrates a cross-sectional structure of a first solar cell and a second solar cell, which are applied to the hybrid type roof panel having the solar cell illustrated in FIG. 5, and FIG. 7 is a cross-sectional view taken along a line A-A of FIG. 5 and illustrates a connection structure of the first solar cell and the second solar cell.

As illustrated in FIG. 6, the first solar cell 21 and the second solar cell 22 are attached to a space between the roof glass upper plate 11 and the roof glass lower plate 12 using an adhesive film 24 formed of a binding agent, such as PVB, and protection films 25 and 26 having high elasticity characteristics are interposed between the first solar cell 21 and the adhesive film 24 and between the second solar cell 22 and the adhesive film 24 so as to reinforce shock resistance characteristics.

In other words, the roof panel 100 having the solar cell according to the present invention has a structure in which the protection films 25 and 26 and the adhesive film 24 are sequentially stacked on top and bottom surfaces, respectively, of the first solar cell 21 and the second solar cell 22, and the roof glass upper plate 11 and the roof glass lower plate 12 are stacked and attached to an outer side of the adhesive film 24 disposed at both upper and lower sides of the first solar cell 21 and the second solar cell 22.

The edge part of the roof glass lower plate 12 on which the second solar cell 22 is disposed, a bottom surface of which is coated with a ceramic material, thus constitutes the ceramic coating part 23.

A glass material having a thickness of about 2.0 mm may be used in the roof glass upper plate 11 and the roof glass lower plate 12. Other internal configurations, i.e., an overall thickness of a solar cell module (the first solar cell 21 or the second solar cell 22), the protection films 25 and 26 and the adhesive film 24 may be about 4.7 mm. In this case, a module having an overall thickness of about 0.2 to 4.0 mm is used as the solar cell module.

In this way, the roof panel 100 having the solar cell preferably uses different types of the first solar cell 21 and the second solar cell 22 in a hybrid manner, since the thickness of a solar cell module that constitutes the first solar cell 21 and the thickness of a solar cell module that constitutes the second solar cell 22 may be different from each other, a step difference may occur when each solar cell module is attached onto the bottom surface of the roof glass upper plate 11 and then the roof glass lower plate 12 is laminated with the roof glass upper plate 11. As a result, when the roof glass lower plate 12 is laminated onto the solar cell module, a laminated portion may be adversely affected.

Thus, in the present invention, a thickness difference between the first solar cell 21 and the second solar cell 22 that are adjacent to each other in the edge part of the roof glass 10 or the roof panel 100 is removed and offset by adjusting the thicknesses of the protection films 25 and 26.

That is, the thickness of the first protection film 25 stacked on both top and bottom surfaces of the first solar cell 21 and the thickness of the second protection film 26 stacked on both top and bottom surfaces of the second solar cell 22 are appropriately adjusted based on the thickness difference between the first solar cell 21 and the second solar cell 22 so that a step difference that occurs due to the thickness difference between the first solar cell 21 and the second solar cell 22 can be removed.

For example, as illustrated in FIG. 7, when the first solar cell 21 is thicker than the second solar cell 22, the thickness of the second protection film 26 is configured larger than the thickness of the first protection film 25 in consideration of the thickness difference between the first solar cell 21 and the second solar cell 22, so that the thickness difference between the first solar cell 21 and the second solar cell 22 can be removed.

In addition, by adjusting the thickness of the adhesive film 24 together with the protection films 25 and 26, the thickness difference between the first solar cell 21 and the second solar cell 22 can also be removed.

As illustrated in FIGS. 5 and 7, wires, such as an inner wire 27 and an outer wire 28, are used to secure outputs of the first solar cell 21 and the second solar cell 22 that are adjacent to each other in the edge part of the roof glass 10 or the roof panel 100.

For example, an electrode of the first solar cell 21 positioned in the center of the roof panel 100 is electrically connected to one-side electrode of the second solar cell 22 via the inner wire 27, and the outer wire 28 is electrically connected to the one-side electrode of the second solar cell 22 positioned in the edge part of the roof panel 100. The outer wire 28 extends to an outer side of the roof panel 100 or the roof glass 10 and is formed to be positioned at the ceramic coating part 23.

In addition, an outer sealing part 29 preferably is formed in an outer edge of the second solar cell 22 positioned in the edge part of the roof panel 100. The outer sealing part 29 is formed to be closely adhered to an outer end of the second solar cell 22 and the protection film 26 disposed between the roof glass upper plate 11 and the roof glass lower plate 12 so that an edge end of the roof panel 100 can be sealed and finishing of the outer wire 28 can be performed.

In other words, the outer sealing part 29 surrounds the second solar cell 22 and the roof glass upper plate 11 and the roof glass lower plate 12 that are laminated onto both top and bottom surfaces of the second solar cell 22 from an outer side of the roof glass 10 (or roof panel 100), thus sealing them.

Through the outer sealing part 29, laminating characteristics between the above elements can be reinforced, and finishing and stability of the wires can be secured.

As described above, in the hybrid type roof panel 100 having the solar cell according to the present invention, the solar cell modules 21 and 22 are mounted on a space between the roof glass upper plate 11 and the roof glass lower plate 12 so as to be applied to the entire area of the roof panel 100 so that the installation area of the solar cell module is enlarged compared to the related art and a photovoltaic area is increased. In addition, the first solar cell 21 (a semi-transparent solar cell module) having semi-transparent characteristics is used in the center of the roof panel 100, and the second solar cell 22 (an opaque solar cell module) having excellent performance is used in the edge part of the roof panel 100 so that the sense of openness of the sunroof or panorama roof can be secured and simultaneously photovoltaic performance can be improved.

As described above, in a hybrid type roof panel having a solar cell according to the present invention, a solar cell module is mounted in a space between a roof glass upper plate and a roof glass lower plate so as to be applied to the entire area of the roof panel so that the installation area of the solar cell module can be enlarged compared to the related art. In addition, a first solar cell having semi-transparent characteristics is used in the center of the roof panel, and a second solar cell having high performance is used in an edge part of the roof panel so that the sense of openness of the sunroof or the panorama roof is secured and simultaneously, photovoltaic performance can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A hybrid type roof panel having a solar cell in which two types of solar cells are disposed over an entire area of roof glass in a hybrid manner, comprising:
    a first solar cell having transparent characteristics disposed in a center of the roof glass; and
    a second solar cell having better photovoltaic performance than the first solar cell disposed in an edge part of the roof glass.

2. The hybrid type roof panel of claim 1, wherein the roof glass comprises a roof glass upper plate and a roof glass lower plate stacked on top and bottom surfaces, respectively, of the first solar cell and the second solar cell.

3. The hybrid type roof panel of claim 1, wherein protection films are interposed between the top and bottom surfaces of the first solar cell and the second solar cell such that the roof glass is attached to the first solar cell and the second solar cell.

4. The hybrid type roof panel of claim 1, wherein a first protection film is stacked on the top and bottom surfaces of the first solar cell, a second protection film is stacked on the top and bottom surfaces of the second solar cell, and the first protection film and the second protection film are formed with different thicknesses depending on thicknesses of the first solar cell and the second solar cell so as to offset a thickness difference between the first solar cell and the second solar cell.

5. The hybrid type roof panel of claim 1, wherein an electrode of the first solar cell is electrically connected to an electrode of the second solar cell via an inner wire, and an outer wire electrically connected to the electrode of the second solar cell extends to an outer side of the roof glass and is positioned at a ceramic coating part.

6. The hybrid type roof panel of claim 1, wherein an outer sealing part is formed to surround and seal the second solar cell and the roof glass upper plate and the roof glass lower plate that are laminated onto the top and bottom surfaces of the second solar cell from an outer side of the roof glass.

7. The hybrid type roof panel of claim 1, wherein the first solar cell is selected from the group consisting of: a dye-sensitized solar cell module, an amorphous solar cell module, and a combination of the dye-sensitized solar cell module and the amorphous solar cell module.

8. The hybrid type roof panel of claim 1, wherein a silicon solar cell module is used as the second solar cell.

9. The hybrid type roof panel of claim 1, wherein the first solar cell and the second solar cell have thicknesses of less than about 4.0 mm.

10. The hybrid type roof panel of claim 1, wherein the first solar cell is a dye-sensitized solar cell module, and the second solar cell is a silicon solar cell module.

11. A hybrid type roof panel, comprising:
    a first solar cell that is substantially transparent disposed in a center of the roof glass; and
    a second solar cell disposed in an edge part of the roof glass, the second solar cell being made of a different material with better photovoltaic characteristics than the first solar cell.

12. The hybrid type roof panel of claim 11, wherein the first solar cell is a dye-sensitized solar cell module, and the second solar cell is a silicon solar cell module.

* * * * *